(12) United States Patent
Maki

(10) Patent No.: US 10,717,926 B2
(45) Date of Patent: Jul. 21, 2020

(54) CARBON NANOTUBE SINGLE-PHOTON SOURCE

(71) Applicant: KEIO UNIVERSITY, Tokyo (JP)

(72) Inventor: Hideyuki Maki, Sagamihara (JP)

(73) Assignee: KEIO UNIVERSITY, Tokyo (JP)

( * ) Notice: Subject to any disclaimer, the term of this patent is extended or adjusted under 35 U.S.C. 154(b) by 0 days.

(21) Appl. No.: 15/997,285

(22) Filed: Jun. 4, 2018

(65) Prior Publication Data

US 2018/0282621 A1 Oct. 4, 2018

Related U.S. Application Data

(62) Division of application No. 15/131,722, filed on Apr. 18, 2016, now Pat. No. 10,316,247.

(30) Foreign Application Priority Data

| May 20, 2015 | (JP) | 2015-102534 |
| Mar. 18, 2016 | (JP) | 2016-56095 |

(51) Int. Cl.

| *H04B 10/70* | (2013.01) |
| *B82Y 20/00* | (2011.01) |
| *C09K 11/65* | (2006.01) |
| *H01L 33/00* | (2010.01) |
| *H01L 25/16* | (2006.01) |

(52) U.S. Cl.
CPC .............. *C09K 11/65* (2013.01); *B82Y 20/00* (2013.01); *H01L 33/00* (2013.01); *H01L 25/167* (2013.01); *H04B 10/70* (2013.01)

(58) Field of Classification Search
CPC ........... H01L 33/00; H04B 10/70; H01B 1/04; C09K 11/65; B82Y 10/00; B82Y 15/00; B82Y 20/00
USPC ......... 252/500, 502, 508; 977/932, 950, 954
See application file for complete search history.

(56) References Cited

U.S. PATENT DOCUMENTS

| 2010/0006152 A1 | 1/2010 | Hatton et al. | |
| 2010/0247381 A1 * | 9/2010 | Yodh | B82Y 10/00 422/68.1 |
| 2011/0309265 A1 | 12/2011 | Babinec et al. | |
| 2013/0087758 A1 | 4/2013 | Maki et al. | |

FOREIGN PATENT DOCUMENTS

| JP | 2009-147460 A | 7/2009 | |
| JP | 2010078685 A * | 4/2010 | G02F 1/35 |

OTHER PUBLICATIONS

Tayo "Charge impurity as a localization center for singlet excitons in single-wall nanotubes." Physical Review B 86, 125431 (Year: 2012).*

Jul. 20, 2018 Office Action issued in U.S. Appl. No. 15/131,722.
Lefebvre et al., "Photoluminescence Imaging of Suspended Single-Walled Carbon Nanotubes," Nano Letters, vol. 6, No. 8, pp. 1603-1608, 2006.
Holmes, et al. "Room-Temperature Triggered Single Photon Emission from III-Nitrate Site-Controlled Nanowire Quantum Dot," Nano Lett. (2014), pp. 982-986.
Takemoto, et al. Non-classical Photon Emission from a Single InAs/InP Quantum Dot in the 1.3-mm Optical-Fiber Band, Japanese Journal of Applied Physics (2004), vol. 43, No. 7B, pp. L993-L995.
Aharonovich, et al. "Diamond-based single-photon emitters," Rep. Prog. Phys.74 (2011), 076501, pp. 28.
Hoegele, et al. "Photon Antibunching in the Photoluminescence Spectra of a Single Carbon Nanotube," PRL 100 (2008), pp. 217401-1-217401-4.
Endo, T. et al., "Photon antibunching in single-walled carbon nanotubes at telecommunication wavelengths and room temperature," Applied Physics Letters, 2015, pp. 113106-1 to 113106-5, vol. 106.
Mar. 8, 2018 Office Action Issued in U.S. Appl. No. 15/131,722.
Piao "Brightening of carbon nanotube photoluminescence through the incorporation of sp3 defects.", Nature Chemistry (2013), vol. 5, 840.
Ma 2014 "Electronic Structure and Chemical Nature of Oxygen Sopant States in Carbon Nanotubes." ACSNano (2014), vol. 8, No. 10, 10782-10789.
Miyauchi "Brightening of excitons in carbon nanotubes on dimensionality modification." Nature Photonics, Sep. 2013, vol. 7.
Hartman "Photoluminescence imaging of solitary dopant sites in covalently doped single-wall carbon nanotubes." Nanoscale, 2015, 7, 20521.
Ma "Room-temperature single-photon generation from solitary dopants of carbon nanotubes," Nature Nanotechnology 2015, vol. 10, pp. 671 et seq.

* cited by examiner

*Primary Examiner* — Tri V Nguyen
(74) *Attorney, Agent, or Firm* — Oliff PLC

(57) ABSTRACT

An atom, molecule, atomic layer molecular layer is adhered to a carbon nanotube surface, or the surface is doped with the atom, molecule, atomic layer, or molecular layer, to form a deep localized level so that an exciton is localized. Alternatively, an atom, molecule, inorganic or organic substance of an atomic or molecular layer, a metal, a semiconductor, or an insulator is absorbed to, deposited on, or encapsulated in the carbon tube inside surface to make permittivity of the portion undergoing the absorption, deposition, or encapsulation higher than that of a clean portion free of the absorption, deposition, or encapsulation so that binding energy of the exciton in the clean portion is high, or reduce a band gap of the portion undergoing the absorption, deposition, or encapsulation so that the exciton is confined and localized in the clean portion or the position undergoing the absorption, deposition, or encapsulation.

17 Claims, 13 Drawing Sheets

ANTIBUNCHING

CARBON NANOTUBE SINGLE-PHOTON SOURCE

CROSS-REFERENCE TO RELATED APPLICATION

This is a Divisional of application Ser. No. 15/131,722 filed Apr. 18, 2016, which claims priority to JP 2015-102534 filed on May 20, 2015 and JP 2016-56095 filed on Mar. 18, 2016. The disclosure of the prior applications is hereby incorporated by reference herein in its entirety.

TECHNICAL FIELD

The present invention relates to a carbon nanotube single-photon source. In particular, the present invention relates to a carbon nanotube single-photon source that can generate a single photon in a telecommunication wavelength band even at temperatures above 50 K, including room temperatures.

BACKGROUND ART

Single photons, or photons of which the number included in a pulse is limited to one, have recently been attracting attention in basic research fields related to quantum mechanics and in applied research fields such as absolutely secure quantum cryptographic communication with eavesdropping detection (see Japanese Patent Application Laid-Open No. 2009-147460 (Patent Literature 1)). In particular, long distance single photon transmission in 1.3-μm and 1.55-μm wavelength bands, which are low-loss regions (telecommunication wavelength band) of optical fibers, are needed for the practical use of quantum cryptographic communication.

Conventionally, as a single-photon generation source in the telecommunication wavelength band, a laser light source is simply attenuated to obtain a single photon. However, the low generation efficiency of the single photon causes a significant decrease in transmission distance and communication speed. A single-photon light source that generates a single photon with high efficiency and high reliability is thus desired to be constructed.

As materials for achieving the generation of a single photon, compound semiconductor quantum dots, defects in diamonds (NV centers), and the like have been reported. There has been observed an antibunching behavior which is evidence of suppression of simultaneous photon generation during the generation of a single photon (see M. J. Holmes et. al., "Room-Temperature Triggered Single Photon Emission from a III-Nitride Site-Controlled Nanowire Quantum Dot," Nano Lett. 2014, 14, 982-986. (Non-Patent Literature 1), K. Takemoto et. al., "Non-classical Photon Emission from a Single InAs/InP Quantum Dot in the 1.3-μm Optical-Fiber Band," Japanese Journal of Applied Physics Vol. 43, No. 7B, 2004, pp. L993-L995. (Non-Patent Literature 2), I. Aharonovich et. al., "Diamond-based single-photon emitters," Rep. Prog. Phys. 74 (2011) 076501 (28 pp). (Non-Patent Literature 3)).

Single-photon sources in the telecommunication wavelength band are currently constructed by using InAs or other compound semiconductor quantum dots. Such single-photon sources are only operable at extremely low temperatures like 10 K, and thus require cooling by liquid helium which is expensive and rare resources.

The generation of a single photon at room temperatures is achieved by using CdSe, GaN, or other compound semiconductors or diamond NV centers. In any of these, the emission wavelength is the visible range, and the generation of a single photon in the telecommunication wavelength band at room temperatures has not been reported.

An exciton is a pair of electron and a hole bound to each other. Carbon nanotubes have exciton binding energy of approximately several hundreds of milli-electron volts, which is approximately 10 times that of conventional solid semiconductors. This allows the stable presence of an exciton at room temperatures.

Localized excitons or confined excitons can be formed to limit the number of excitons in a carbon nanotube to one through discretization of levels as with a quantum dot and through annihilation of excitons. Such a single exciton, when relaxes, generates a photon. This can be utilized to generate a single photon, an only photon included in a light emission pulse.

Carbon nanotubes are known to emit light in a near infrared range of approximately 0.8 to 2 μm in wavelength, depending on the chirality which indicate the structure of the carbon nanotubes and diameter. In particular, carbon nanotubes emit light in the telecommunication wavelength band which is low-loss ranges of optical fibers (1.3 μm and 1.55 μm in wavelength. Carbon nanotubes are thus expected to generate a single photon having a wavelength in the telecommunication wavelength band. At present, the generation of a single photon in the telecommunication wavelength band from a carbon nanotube has not been reported.

It has heretofore been reported that a carbon nanotube produced a single photon from a localized exciton at temperatures 50 K or lower (see A. Hoegele et. al., "Photon Antibunching in the Photoluminescence Spectra of a Single Carbon Nanotube," PRL 100, 217401 (2008). (Non-Patent Literature 4)). However, the produced single photon was not in the telecommunication wavelength band. There has been no report of a single photon obtained at high temperatures above 50 K, including room temperatures.

SUMMARY OF INVENTION

Technical Problem

Single photons in the telecommunication wavelength band at room temperatures are pseudo single photons obtained by simple attenuation of laser. The generation probability of the single photons is thus low, and there is at present no single-photon source in the telecommunication wavelength band at room temperatures in which the number of photons in a pulse is controlled to one, among all kinds of substances.

Carbon nanotubes can produce single photons at temperatures of 50 K or lower, with wavelengths other than in the telecommunication wavelength band. However, single photons have not been produced at high temperatures above 50 K to above room temperatures.

Solution to Problem

The present invention has been made in order to solve the above-described problems in the conventional technique, and an object thereof is to provide a photon source that can generate a single photon in the telecommunication wavelength band even at temperatures above 50 K, including room temperatures.

If a stable "localized exciton" is obtained at temperatures above 50 K, including room temperatures, then a single photon can be generated. The reason why single photons are conventionally obtainable only at or below 50 K is that with high temperatures, the localized exciton is delocalized by thermal energy and the exciton moves freely, in which case a localized exciton fails to be obtained.

In the present invention, for example, an atom, a molecule, an atomic layer (atomic monolayer or atomic multilayer), or a molecular layer is adhered to a surface of a carbon nanotube, or the surface of the carbon nanotube is doped with the atom, molecule, atomic layer (atomic monolayer atomic multilayer), or molecular layer, to form a deep localized level and form a localized exciton. The formation of the deep level facilitates the localization of the exciton up to high temperatures. This can be achieved, for example, by adhesion of amorphous carbon or alumina or by doping with oxygen.

Like or a side from the foregoing, an atom, a molecule, an inorganic or organic substance of an atomic monolayer, atomic multilayer (atomic layer), or molecular layer, a metal, a semiconductor, or an insulator is absorbed to, deposited on, or encapsulated in the surface or inside of the carbon nanotube to make permittivity of a portion undergoing the absorption, deposition, or encapsulation higher than that of a clean portion free of the absorption, deposition, or encapsulation. As shown in FIGS. 1A and 1B, clean portions 10A free of the absorption, deposition, or encapsulation have a low effective permittivity because both the inside and outside of the carbon nanotube (CNT) 10 are vacuum, which has a lowest relative permittivity of approximately 1. Portions 12 undergoing the absorption, deposition, or encapsulation increase in effective permittivity because such substances have a relative permittivity higher than 1. If the effective permittivity increases due to the external environment, the coulomb interaction decreases. Consequently, as shown in FIGS. 1A and 1B, the exciton binding energy or the band gap decreases. As shown in FIG. 1A, if the decrease in the exciton binding energy due to increased permittivity is dominant, the binding energy of the exciton 14 decreases near the absorbed, deposited, or encapsulated substance 12. As compared to the carbon nanotube portions near the absorbed, deposited, or encapsulated substance 12 where the binding energy of the exciton is low, the binding energy of the exciton becomes higher in the clean carbon nanotube portion 10A free of such substance. This decreases the potential to the exciton 14, and the exciton becomes more likely to be confined in the clean portion 10A. The localized exciton thus exists stably in the clean portion even at high temperatures. As shown in FIG. 1B, if the decrease in the band gap is dominant, the band gap decreases near the absorbed, deposited, or encapsulated substance 12. As compared to the clean portions 10A where the band gap is wide, the band gap becomes narrower near the absorbed, deposited, or encapsulated substance 12. This makes the exciton 14 more likely to be confined in near the absorbed, deposited, or encapsulated substance 12. The localized exciton thus exists stably in near the absorbed, deposited, or encapsulated substance even at high temperatures. When the permittivity changes, whether the effect of the decrease in the exciton binding energy is dominant or the effect of the decrease in the band gap is dominant depends on the type of the substance near the absorbed, deposited, or encapsulated substance formed on/in the carbon nanotube and the state of the absorption/deposition. The electronic state and optical properties of the carbon nanotube itself are also affected by the absorption, deposition, or encapsulation. An exciton confinement structure tailored to the constituent substances can thus be constructed to effectively localize an exciton.

Such substances may be an inorganic or organic substance of an atomic monolayer, atomic multilayer, or molecular layer, a metal, a semiconductor, or an insulator that is unintentionally absorbed, deposited, or encapsulated. Substances introduced during the growth of the carbon nanotube may thus be used to control the permittivity inside and outside the carbon nanotube without special absorption, deposition, or encapsulation.

To control the permittivity, an inorganic or organic substance of an atomic monolayer, atomic multilayer, or molecular layer, a metal, a semiconductor, or an insulator may be artificially absorbed, deposited, or encapsulated by any possible method, including evaporation, sputtering, spin coating, solution impregnation, and injection. Such substances may be absorbed to, deposited on, or encapsulated in controlled sites of the carbon nanotube. The substances may be formed in random locations.

The used carbon nanotube may be a suspended carbon nanotube, a carbon nanotube placed on a substrate surface, or a carbon nanotube embedded in a substance such as a thin film. In the case of the suspended carbon nanotube, the effect of the absorption or deposition to/on the carbon nanotube appears significantly. The carbon nanotubes on the substrate surface and in a substance also provide the effect of the absorption or deposition. In the case of the carbon nanotube on the substrate surface or in a substance, the substantial permittivity to the exciton in the carbon nanotube fluctuates spatially due to nonuniformity of physical and chemical contact between the carbon nanotube and the substrate or substance. This provides an effect of exciton confinement and localization like the effect of the absorption or deposition. A similar effect of exciton confinement and localization can thus be obtained even without absorption or deposition. The encapsulation of a substance is effective for any of the suspended, on-the-substrate-surface, and in-substance carbon nanotubes.

The higher the permittivity, the greater a change in the confinement potential and the higher the localizability. For example, if a conductive substance such as a metal and amorphous carbon is absorbed, deposited, or encapsulated, a screening effect resulting from the substance increases the effective permittivity to the exciton. This increases the change in potential and provides a high confinement effect. The higher the permittivity, the lower the exciton binding energy. If the effect of the change in the exciton binding energy is high, the exciton becomes unstable in the carbon nanotube portions near the absorbed, deposited, or encapsulated substance where the permittivity is high. The exciton is then stably confined in a clean portion. If the effect of the change in the band gap is high, the band gap decreases as the permittivity increases. The exciton can thus be confined in near the absorbed, deposited, or encapsulated substance where the permittivity is high. If a conductive substance is absorbed, deposited, or encapsulated, spreading of the wave functions of the electron and hole constituting the exciton increases, which provides the effect of controlling the stability of the exciton. Like metals, semiconductors have conductivity, and thus provide a high screening effect which increases the effective permittivity. Even insulators having low conductivity, metals, molecules, and organic substances have a relative permittivity higher than that of vacuum, 1, and thus provide the effect of increasing the permittivity. The higher the effective permittivity, the higher the potential for confining the exciton and the higher the exciton confinement effect. Any substance has a permittivity higher than that of vacuum, and thus has the effect of confining the exciton.

For example, as shown in FIG. 2A, another substance (for example, alumina $Al_2O_3$ deposited by atomic layer deposition (ALD)) 12 is deposited around a carbon nanotube (CNT) 10. This can increase the permittivity near the deposited substance 12 to confine an exciton. For example, as shown in FIG. 2B, the emission spectrum of the CNT shows that the deposition of the alumina decreases the band gap and causes a red shift of the emission wavelength. The red shift indicates that an exciton is confined in the CNT portion where the alumina is deposited. As shown in FIG. 2C, if the effect of the exciton binding energy is high, an exciton 14 can be confined in a clean portion 10A between the deposited substances 12. In FIG. 2C, e represents an electron, h represents a hole, and 12 represents the deposited substances such as amorphous carbon.

As shown in FIG. 3, the CNT 10 may include an encapsulated substance 13 on both axial sides of a clean portion 10A so that the portions including the encapsulated substance 13 have a high permittivity and the clean portion 10A free of the encapsulated substance 13 has a low permittivity.

The observation of a single photon may be facilitated by using the effect that free exciton emission is quenched (suppressed) by the carbon nanotube portion(s) near the absorbed, deposited, or encapsulated substance, or the absorbed, deposited, or encapsulated substance itself. To efficiently obtain a single photon at high temperatures, light emission from thermally-excited delocalized free excitons needs to be suppressed. At high temperatures, some or many of the foregoing localized exciton and excitons confined by permittivity control can be thermally excited into delocalized free excitons. In such a case, light emission from the free excitons occurs simultaneously with the light emission from the localized exciton from which a single photon is obtained. As a result, the state where the number of photons in a pulse is suppressed to one fails to be created, and a single photon fails to be obtained. On the other hand, suppose that the light emission from free excitons is quenched by the carbon nanotube portion(s) near the absorbed, deposited, or encapsulated substance, or the absorbed, deposited, or encapsulated substance itself. In such a case, free excitons, if any, do not emit light. Since the extraction of a single photon from the localized exciton is not interfered, a single photon is more likely to be obtained even at high temperatures.

A practical example of the present invention will be described. FIG. 4 shows a suspended carbon nanotube which is a single-walled carbon nanotube (SWNT) bridging a trench (groove) in a line-and-space substrate manufactured by fine processing technology. The suspended SWNT was excited by pulse laser light irradiation at a wavelength of 800 nm to generate a single photon. FIG. 5A shows the emission spectrum of the obtained light emission. In this sample, an emission spectrum at wavelengths of approximately 1.3 µm, the telecommunication wavelength band, was obtained. A photon correlation measurement for confirming the generation of a single photon was performed with respect to the light emission. As shown in FIG. 5B, antibunching of reducing the second-order correlation function a delay time of 0 sec was observed, whereby the occurrence of nonclassical light with suppressed photon concurrence was confirmed. More specifically, the normalized second-order correlation function at the delay time of zero (referred to as $g^{(2)}(0)$), which indicates the suppression of concurrence of two photons, has a substantially constant value of smaller than 1 (<0.6) from low temperatures to room temperatures. An antibunching characteristic indicating the occurrence of a single photon was stably obtained from low temperatures to room temperatures.

The present invention has been achieved on the basis of the foregoing findings, and solved the foregoing problem by the provision of a carbon nanotube single-photon source in which an exciton is localized at high temperatures above 50 K.

An atom, a molecule, an atomic layer (atomic monolayer or atomic multilayer), or a molecular layer can be adhered to a surface of a carbon nanotube, or the surface of the carbon nanotube can be doped with the atom, molecule, atomic layer (atomic monolayer or atomic multilayer), or molecular layer, to form a deep localized level so that an exciton is localized.

An atom, a molecule, an inorganic or organic substance of an atomic layer or molecular layer, a metal, a semiconductor, or an insulator absorbed to, deposited on, or encapsulated in a surface or inside of a carbon nanotube makes permittivity of a portion undergoing the absorption, deposition, or encapsulation higher than that of a clean portion free of the absorption, deposition, or encapsulation. If an effect of a change in exciton binding energy due to the change in permittivity is high, the exciton binding energy in the clean portion increases, whereby an exciton can be confined and localized in the clean portion. If an effect of a change in a band gap due to the change in permittivity is high, the band gap of the portion undergoing the absorption, deposition, or encapsulation decreases, whereby an exciton can be confined and localized in the portion undergoing the absorption, deposition, or encapsulation.

An atom, a molecule, an inorganic or organic substance of an atomic layer or molecular layer, a metal, a semiconductor, or an insulator is absorbed to, deposited on, or encapsulated in a surface or inside of a carbon nanotube to make permittivity of a portion undergoing the absorption, deposition, or encapsulation higher than that of a clean portion free of the absorption, deposition, or encapsulation. If the effect of a change in the exciton binding energy due to the change in permittivity is high, the exciton binding energy in the clean portion increases, whereby an exciton can be confined and localized in the clean portion. If the effect of a change in the band gap due to the change in permittivity is high, the band gap of the portion undergoing the absorption, deposition, or encapsulation decreases, whereby an exciton can be confined and localized in the portion undergoing the absorption, deposition, or encapsulation.

Light emission from a thermally-excited delocalized free exciton can be suppressed by a carbon nanotube portion near the absorbed, deposited, or encapsulated substance of the inorganic substance, organic substance, metal, semiconductor, car insulator, or the absorbed, deposited, or encapsulated substance itself.

The substance absorbed to, deposited on, or encapsulated in the surface or inside of the carbon nanotube may be a conductive substance (for example, amorphous carbon).

A generation method (excitation method) of an exciton for generating a single photon may be excitation by light irradiation (photoluminescence) or current injection excitation by energization (electroluminescence). An exciton generated by any method can generate a single photon by the above-described method.

Advantageous Effects of Invention

According to the present invention, a single photon can be generated in the telecommunication wavelength band at temperatures above 50 K, including room temperatures. Since liquid helium which is currently needed is not necessary, a large-scale expensive liquid helium cooling system is no longer needed. As compared to a liquid helium-cooled single-photon light source using a compound semiconductor, the single-photon light source can thus be significantly reduced in size. Such a technique enables single photon distribution by optical fibers with liquid nitrogen cooling or without cooling, and can promote the spread of quantum information technologies like quantum cryptographic communication which currently under research for practical use.

BRIEF DESCRIPTION OF DRAWINGS

The preferred embodiments will be described with reference to the drawings, wherein like elements have been denoted throughout the figures with like reference numerals, and wherein.

DESCRIPTION OF EMBODIMENTS

Embodiments of the present invention will be described below in detail with reference to the drawings. It should be noted that the present invention is not limited to the contents described in the following embodiments and practical examples. The components of the embodiments and practical examples described below may include ones easily conceivable by those skilled in the art, substantially identical ones, and ones within the range of equivalency. The components disclosed in the embodiments and practical examples described below may be combined as appropriate, and may be selected and used as appropriate.

Figure 1B:
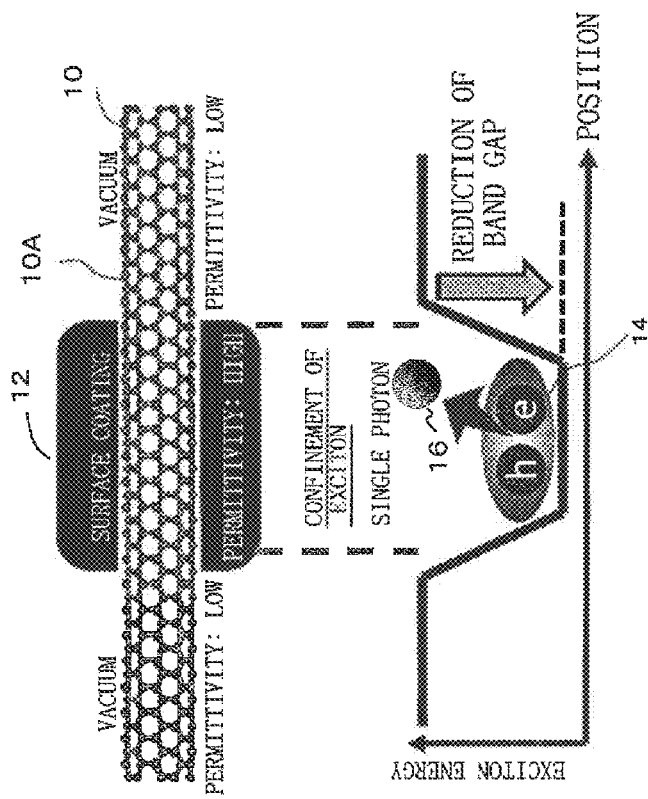
FIGS. 1A and 1B are schematic diagrams for describing the principle of the present invention.
Figure 1A:
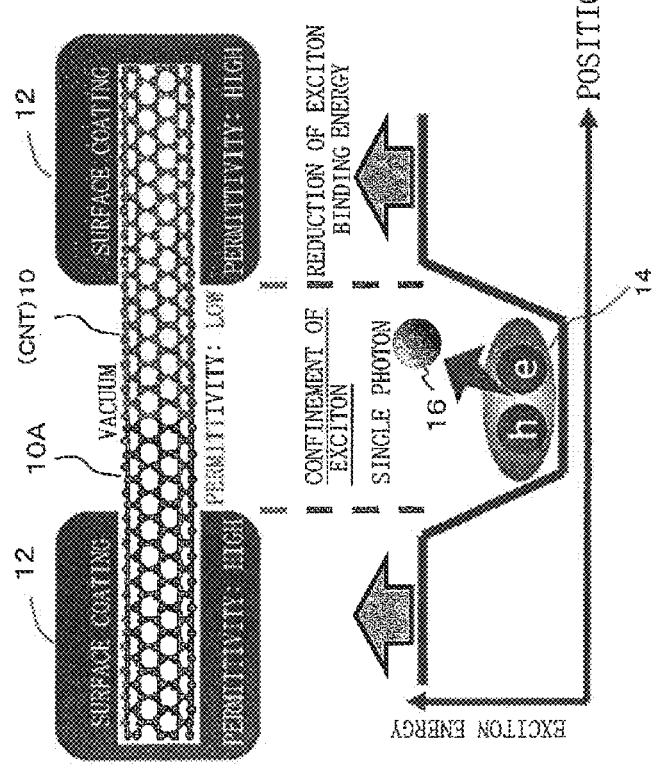
Figure 2A:
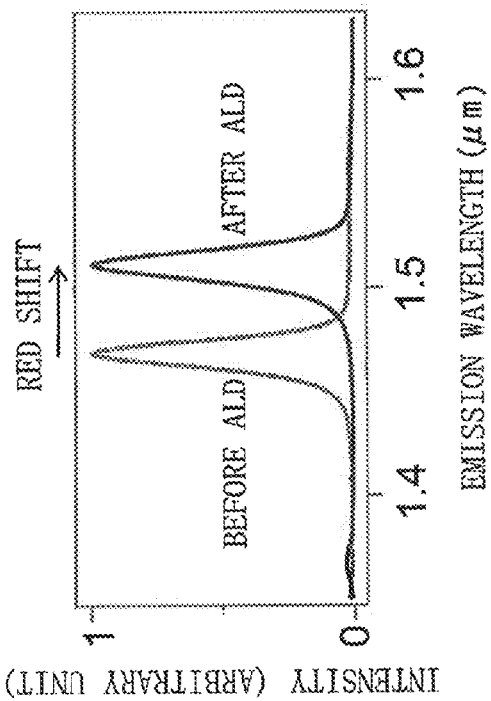
FIGS. 2A, 2B, and 2C are schematic diagrams showing a deposited substance and an effect thereof.
Figure 2B:
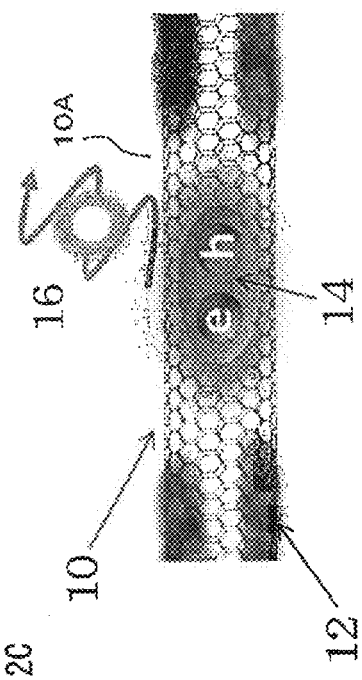
Figure 2C:
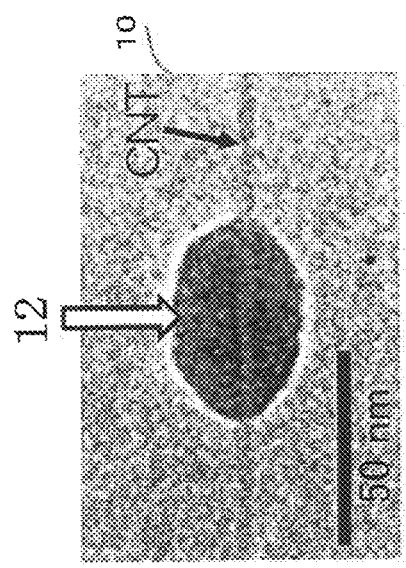
Figure 3:
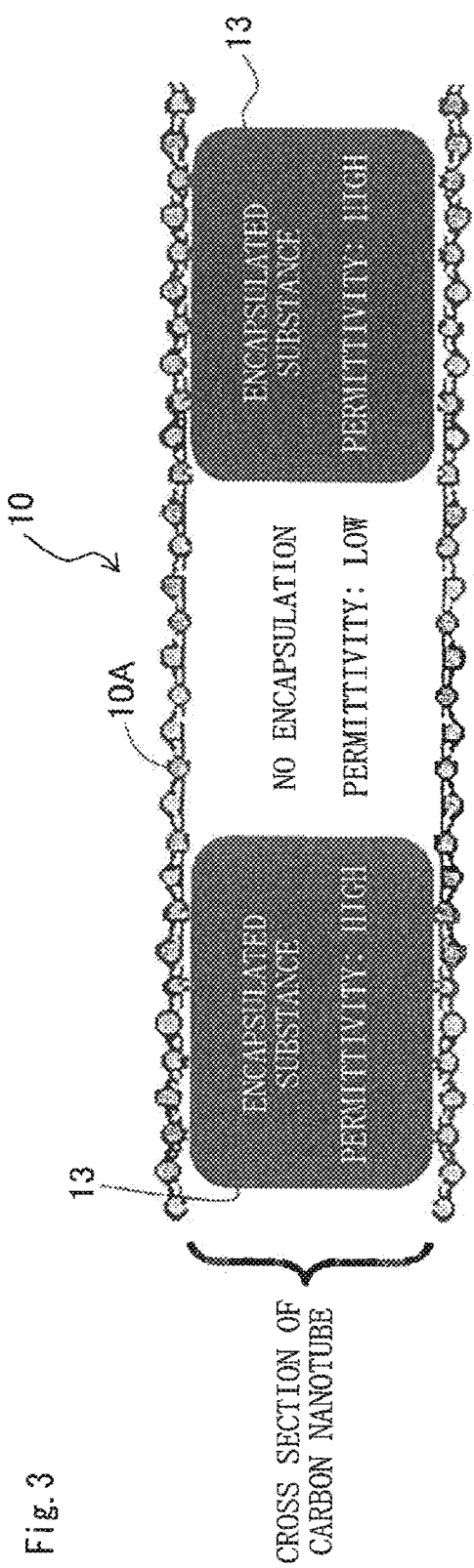
FIG. 3 is a schematic diagram showing an exciton confined by an encapsulated substance.
Figure 4:
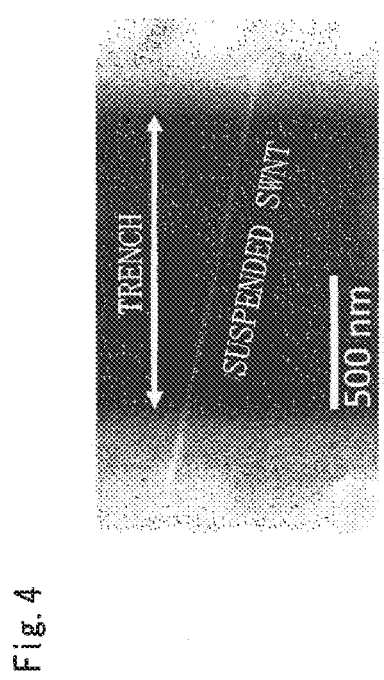
FIG. 4 is a diagram showing a typical electron microscopic picture of an individual suspended single-walled carbon nanotube (SWNT) used for antibunching observation.
Figure 5A:
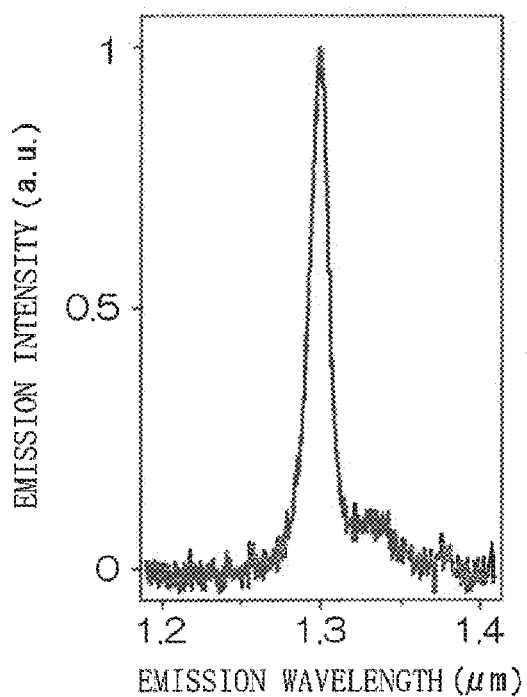
FIG. 5A is a chart showing an example of an emission spectrum from a single-walled carbon nanotube at room temperatures.
Figure 5B:
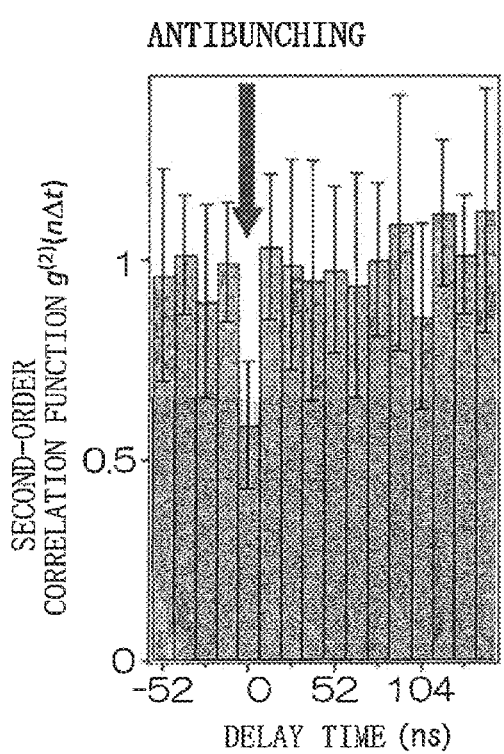
FIG. 5B is a chart; showing photon correlation measurements of the same carbon nanotube at room temperatures.
Figure 6:
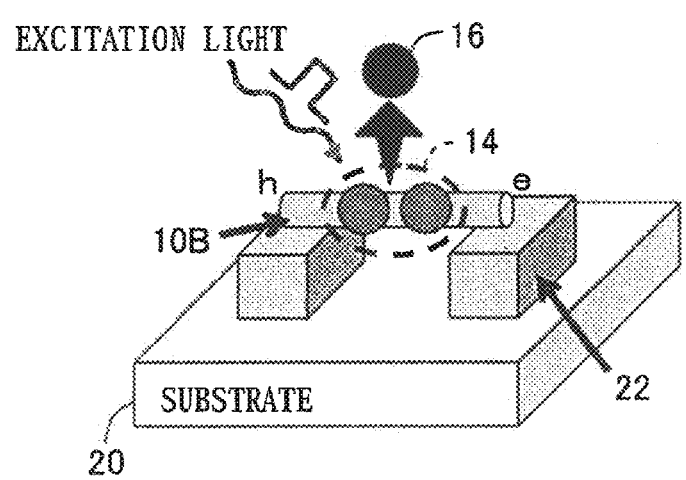
FIG. 6 is a perspective view showing an example of occurrence of a single photon from a suspended single-walled carbon nanotube (SWNT) which is a first embodiment of the present invention.

FIG. 6 shows a first embodiment of the present invention in which a single photon is generated from a suspended single-walled carbon nanotube (simply called as suspended carbon nanotube) 10B. A substrate (for example, Si substrate) 20 having an uneven structure such as pillars (for example, $SiO_2$ pillars) 22 can be used to obtain the suspended carbon nanotube 10B which bridges the pillars 22. The suspended carbon nanotube 10B is easy to produce high-efficiency light emission and is likely to provide absorption and deposition effects. The carbon nanotube has only to be isolated from the substrate 20. A carbon nanotube on an ordinary substrate can thus provide similar effects if curved or otherwise isolated in part from the substrate. A current injection single-photon source can be used to obtain a single-photon source using the suspended structure.

Figure 7:
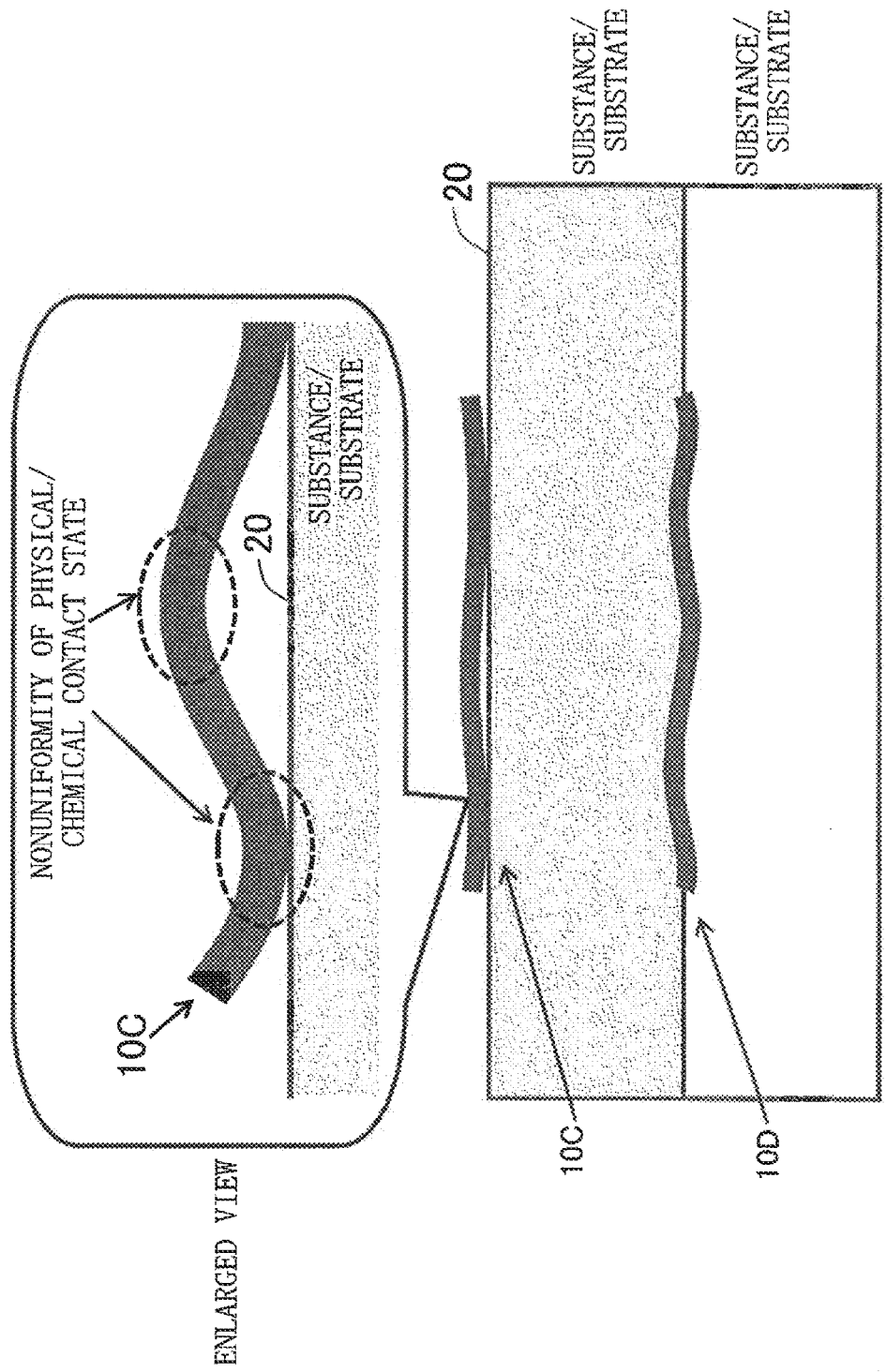
FIG. 7 is a sectional view showing a carbon nanotube on a substrate surface and a carbon nanotube embedded in a substance, which are a modification of the first embodiment.

Like a modification shown in FIG. 7, the carbon nanotube for obtaining a single photon may be a carbon nanotube 10C arranged on the surface of the substrate (substance) 20 or a carbon nanotube 10D embedded in the substance (substrate) 20. If the physical and chemical contact between the carbon nanotube and the substrate or substance is not uniform at the substrate surface or in the substance, the substantial permittivity to an exciton fluctuates spatially. This provides the effect confinement and localization of the exciton.

Figure 8:
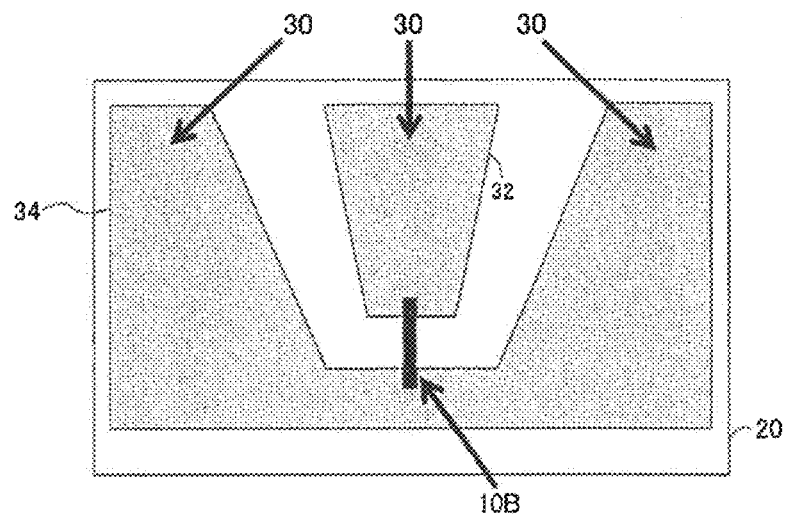
FIG. 8 is a plan view showing a carbon nanotube arranged on a coplanar waveguide, which is a second embodiment of the present invention.

To generate a single photon at a high rate or in a short pulse form, an element can be configured so that an electrical, voltage, or current signal of high frequency can be applied with the characteristic impedance controlled to a constant value (for example, $50\Omega$ or $75\Omega$). This enables the generation of a single photon at a high frequency or in a short pulse. For example, FIG. 8 shows a second embodiment of the present invention which is applied to a coplanar waveguide. As shown in FIG. 8, a single-photon generation device including a waveguide structure such as a characteristic impedance-controlled stripline (a line of conductor foil formed in a plate-like dielectric substrate on the surface and backside of which conductor foil is formed), microstripline line of conductor foil formed on the surface of a plate-like dielectric substrate on the surface of which conductor foil is formed), and a coplanar waveguide (lines of conductor foil formed on the surface of a late-like dielectric substrate) can be fabricated to apply a high-frequency electrical signal to the carbon nanotube. This enables the generation of a single photon at a high frequency or in a short pulse. In the diagram, 30 designates a coplanar waveguide including a signal electrode 32 and a ground electrode 34.

Figure 9:
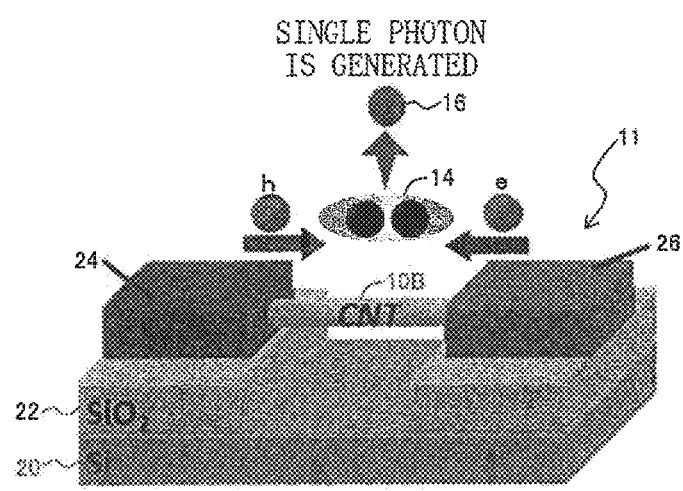
FIG. 9 is a perspective view schematically showing a current injection single-photon generation element which is a third embodiment of the present invention.

Like a third embodiment shown in FIG. 9, a current injection single-photon generation element 11 can be made of an element in which two simple terminal electrodes 24 and 46 are formed at both ends of the suspended carbon nanotube 10B.

Figure 10:
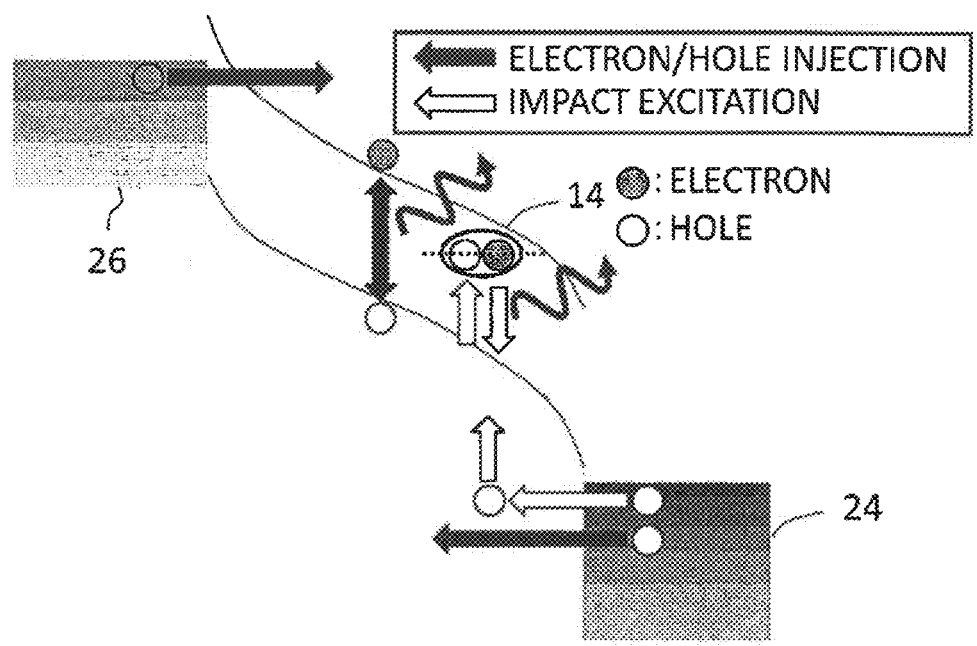
FIG. 10 is a schematic diagram showing an excitation mechanism of light emission according to the third embodiment.

In the third embodiment, the work functions of the electrodes 24 and 26 can be controlled to control the Schottky barrier between the electrodes and the carbon nanotube so that the injection efficiencies of an electron e and a hole h increase. A single photon can thus be generated with high efficiency. Metals, alloys, and compounds having a high work function, such as Pt, Au, Ni, Mo, W, Co, and Cr, may be used as a hole injection electrode 24 having a high work function. Metals, alloys, and compounds having a low work function, such as Ca, Mg, Al, Cs, K, and Li, can be used as an electron injection electrode 26 having a low work function. Semiconductors may be used as the electrodes 24 and 26. Among semiconductor materials such as silicon and GaAs, n-type semiconductors may be used as the electron injection electrode 26, and p-type semiconductors may be used as the hole injection electrode 24. Instead of simultaneously injecting an electron and a hole that are the carriers, either one may be injected to directly form an exciton 14 and obtain a current injection single photon. In such a case, as shown in FIG. 10, when either one of the carriers is injected, an electric field generated by the applied voltage or a Schottky barrier or the like occurring at the interface between the electrode and the carbon nanotube provides high kinetic energy to the carrier. A single photon can be obtained by an impact excitation mechanism that directly forms the exciton from the energy.

Figure 11:
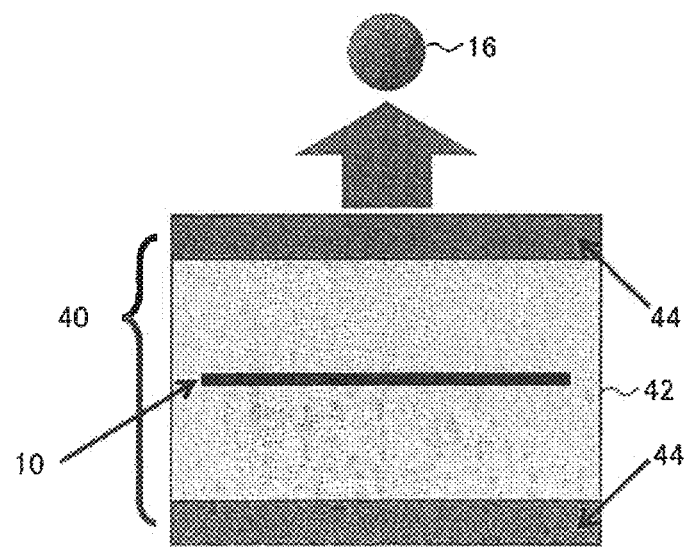
FIG. 11 is a sectional view showing a configuration of a one-dimensional cavity which is a fourth embodiment of the present invention.
Figure 12:
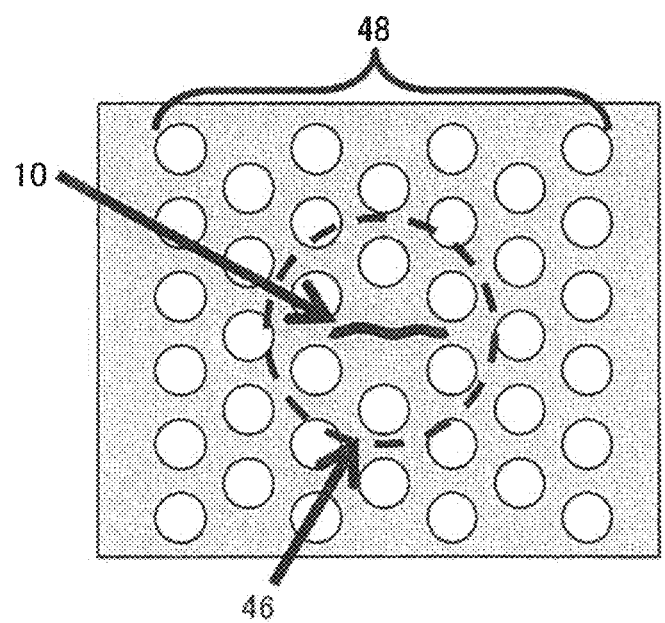
FIG. 12 is a sectional view showing a configuration of a two-dimensional cavity which is a fifth embodiment of the present invention.

FIG. 11 shows a fourth embodiment of a one-dimensional cavity 40. FIG. 12 shows a fifth embodiment of a two-dimensional cavity 46. A single-photon generation element including a carbon tube 10 can thus be formed in a one-, two-, or three-dimensional cavity (photonic crystal of which the refractive index changes periodically) to enable directional, high-efficiency extraction of a single photon. Some cavity structures can generate a single photon that has a wavelength to resonate with the cavity. In the diagrams, 42 designates a cavity portion, 44 designates a metal mirror or dielectric multilayer mirror, and 48 designates a two-dimensional photonic crystal.

According to such embodiments, the cavity structures can be controlled to extract a signal photon having an arbitrary wavelength. This enables, for example, wavelength multiplex single photon distribution.

Figure 13:
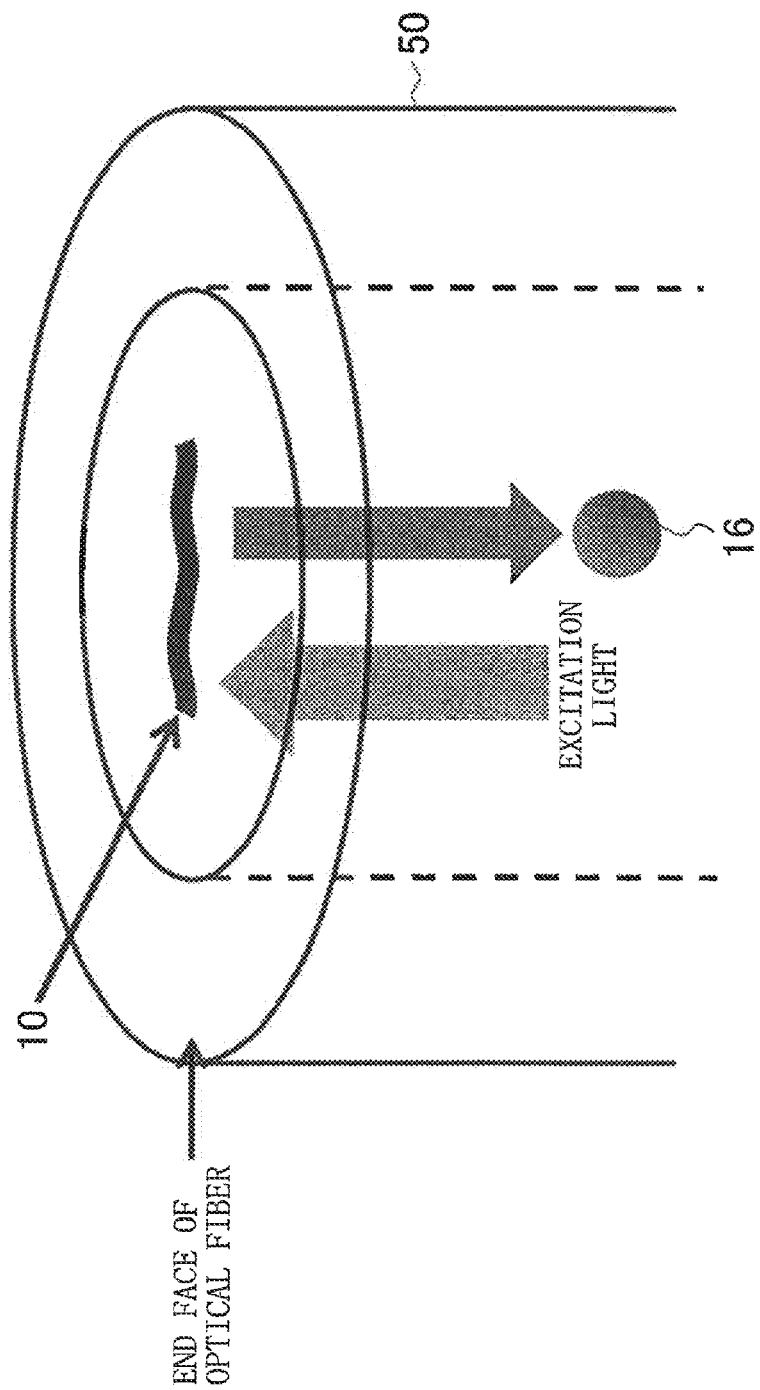
FIG. 13 is a sectional view showing a single-photon light source formed on an end face of an optical fiber, which is a sixth embodiment of the present invention.

Take the case of directly coupling an optical fiber and a single-photon source. A conventional compound semiconductor quantum dot single-photon source includes a large number of quantum dots at high density with respect to the fiber core diameter. It is therefore difficult to directly introduce a single photon from only one of the quantum dots to the optical fiber. Such a quantum dot single-photon source needs to be cooled by liquid helium to near 10 K. The high-precision coupling of the optical fiber in a large-scale cryostat is difficult. On the other hand, with the carbon nanotube single-photon source according to the present invention, the position and density of the carbon nanotube can be freely controlled by using a catalyst. An optical fiber can thus be directly formed with respect to only one carbon nanotube. In addition, a single photon in the telecommunication wavelength band can be obtained at room temperatures, without needing any cooling system. Like a sixth embodiment shown in FIG. 13, a single-photon light source can be easily created by simply forming a carbon nanotube 10 directly on an end face of an optical fiber 50. In such a case, photoexcitation by excitation light and transmission of the generated single photon can be performed by using the same optical fiber 50 to construct a photoexcitation single-photon light source. A current injection single-photon source can also be formed on a cross section of an optical fiber.

The carbon nanotube single-photon source can be directly formed on a silicon or other chip. Like a seventh embodiment shown in FIG. 14, the optical fiber 50 can thus be pressed against and bonded to a single-photon light source 58 on a chip to construct a one-chip single-photon light source that is ultra-small in size and easy to handle. For example, the optical fiber 50 can be directly coupled to a single-photon generation element including the carbon nanotube 10. The single-photon generation element and the optical fiber can be fixed by mechanical tools or bonded with an adhesive material such as epoxy. The single-photon generation element can thus be configured as a chip and integrated with the optical fiber. As a result, an optical fiber-coupled single-photon light source can be constructed.

Figure 15:
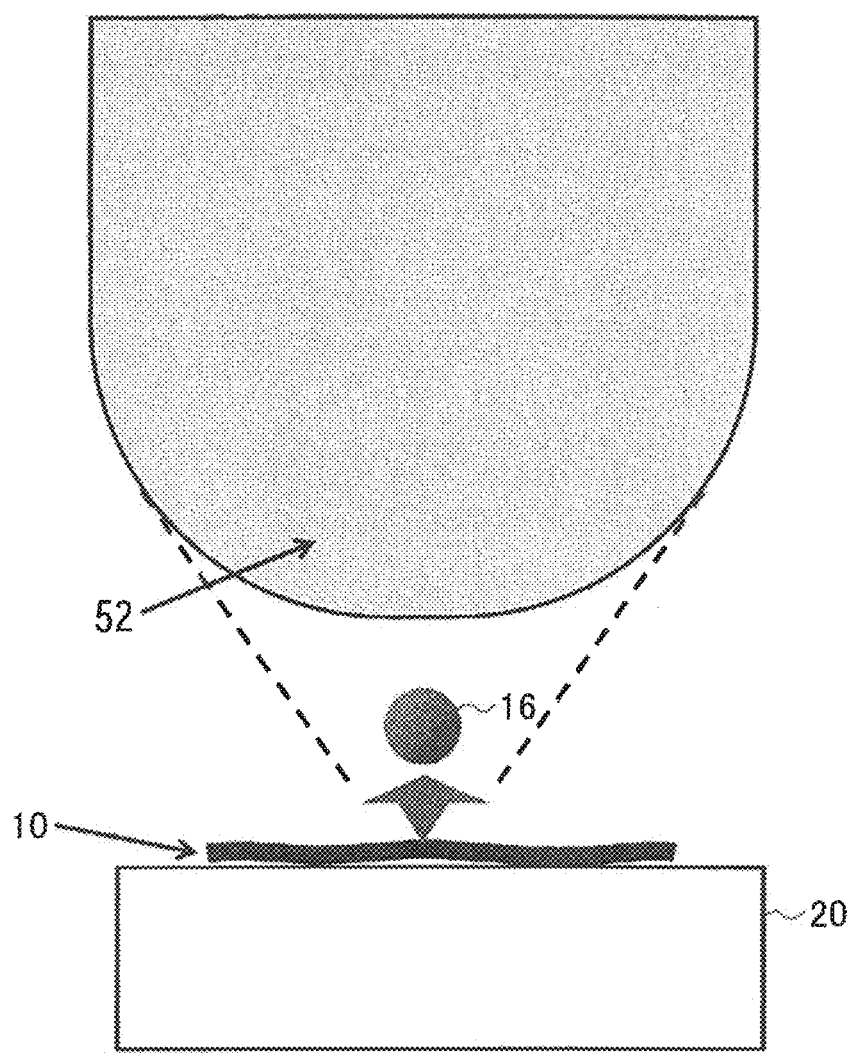
FIG. 15 is an enlarged sectional view showing an example of a bonding state with an optical fiber according to the seventh embodiment.

The optical fiber 50 to be coupled may have an end face of various shapes. The end face may be not only flat or obliquely polished, but may be curved, be spherically or conically polished, or have a controlled refractive index. As shown in FIG. 15, a lensed optical fiber 52 having a lens function can be used for condensing.

If a single-photon light source is bonded to an optical system of an external optical device, an optical fiber, or the like, the single-photon light source can be coupled with various lenses to extract a single photon with high efficiency. Examples of the lenses include an objective lens, a ball lens, a plano-convex lens, and a biconvex lens.

Figure 14:
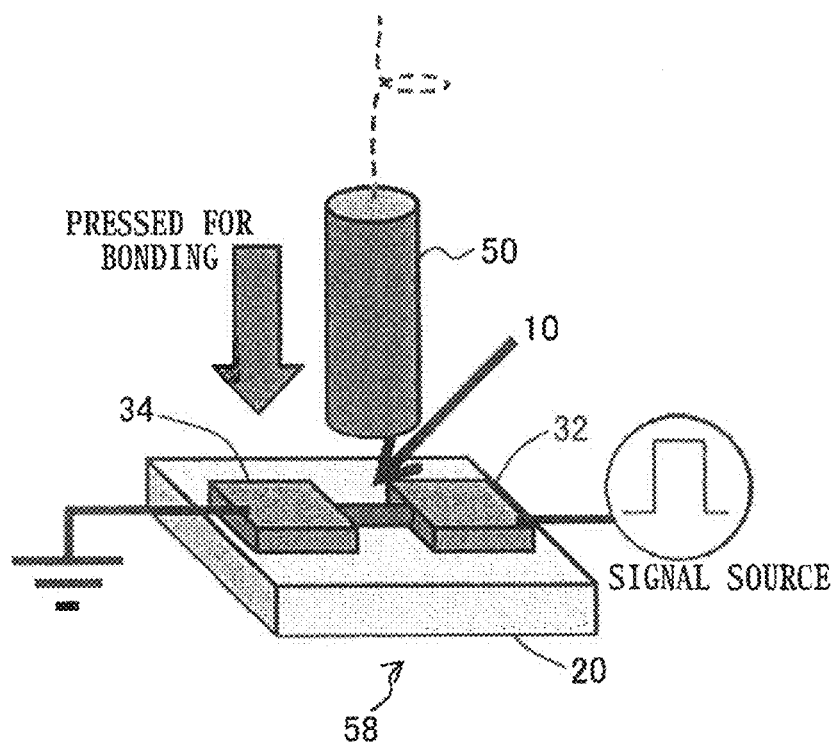
FIG. 14 is a perspective view showing a one-chip single-photon light source which is a seventh embodiment of the present invention.
Figure 16:
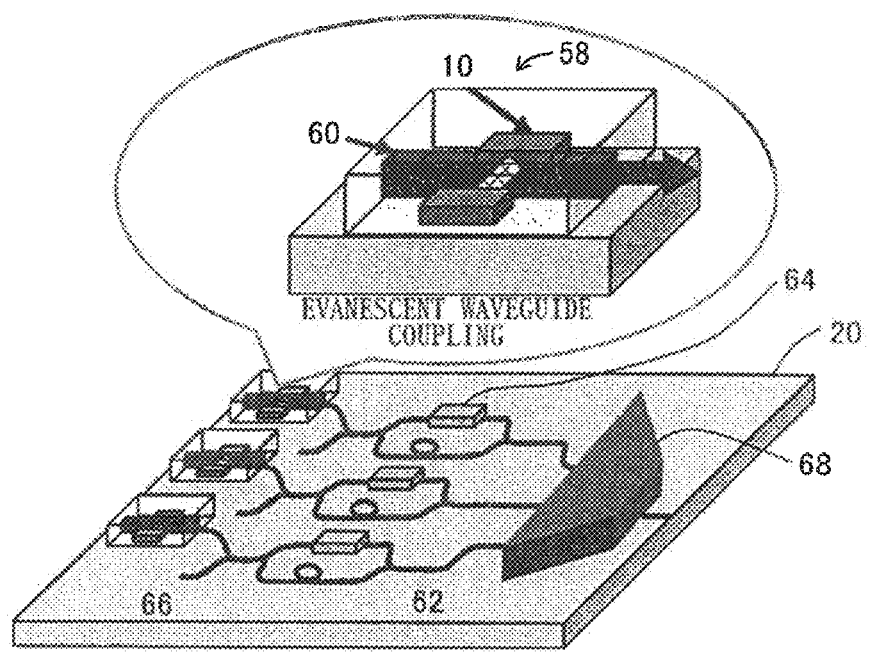
FIG. 16 is a perspective view showing a silicon photonic on-chip single-photon transmitter unit which is an eighth embodiment of the present invention.

Since a carbon nanotube single-photon light source can be directly formed on a silicon substrate, like an eighth embodiment shown in FIG. 16, the carbon nanotube single-photon light source and a silicon optical waveguide can be directly coupled to emit a single photon to the silicon waveguide. Since a carbon nanotube single-photon light source is extremely small in size, the carbon nanotube single-photon light source can be coupled to not only a silicon optical waveguide but also any optical waveguide that can propagate light. Examples include a quartz optical waveguide and optical waveguides made of other materials. The single-photon light source may be formed in a waveguide to introduce a single photon into the waveguide. As shown in FIG. 14, an end face of a waveguide (in FIG. 14, the optical fiber 50) may be pressed against and bonded to the light source formed so that a single photon is introduced into the waveguide (50) from the end face.

As shown in FIG. 16, a light source may be arranged on or near the surface of a waveguide so that a single photon is introduced into the optical waveguide via an evanescent field. If a single photon is introduced into an optical waveguide such as a silicon optical waveguide, a waveguide 60 such as shown in FIG. 16 can be used to directly introduce a single photon into an optical integrated circuit (silicon photonics) including an interference system 62, phase modulators 64, delay paths (circuits) 66, and a multiplexer 68.

In quantum cryptographic applications, cryptographic communication is performed by coding information with polarization or phase states of a single photon emitted from a single-photon source. Conventional quantum cryptography distribution systems are large in size, being assembled from macroscopic optical parts. On the other hand, the carbon nanotube single-photon light source can directly couple a single photon having a communication wavelength to an optical integrated circuit (silicon photonics) at room temperatures. Waveguides, interference systems, phase modulators, delay paths (circuits), and multiplexers using such silicon photonics can thus be used to construct a one-chip quantum cryptography distribution system. As a result, an inexpensive one-chip quantum cryptographic system and a wavelength multiplex multicast distribution technique can be newly constructed.

The single-photon generation element can actual be used as a light source for optical fiber-based quantum cryptographic communication without cooling. Without cooling or with liquid nitrogen cooling, the quantum cryptographic transmitter can be reduced in size.

It should be apparent to those skilled in the art that the above-described embodiments are merely illustrative which represent the application of the principles of the present invention. Numerous and varied other arrangements can be readily devised by those skilled in the art without departing from the spirit and the scope of the present invention.

The invention claimed is:

1. A carbon nanotube single-photon source configured to localize an exciton at high temperatures above 50 K,
   wherein the carbon nanotube single-photon source is a suspended nanotube that includes a portion that has undergone adsorption, deposition, or encapsulation and a clean portion free of the adsorption, deposition, or encapsulation,
   wherein the portion that has undergone adsorption, deposition, or encapsulation has an atom, a molecule, an inorganic or organic substance of an atomic layer or molecular layer, a metal, a semiconductor, or an insulator adsorbed on, deposited on, or encapsulated in a surface or inside of the suspended carbon nanotube,
   wherein the portion that has undergone the adsorption, deposition, or encapsulation has a permittivity higher than a permittivity of the clean portion free of the adsorption, deposition, or encapsulation, whereby an exciton is confined and localized in either the portion that has undergone adsorption, deposition, or encapsulation or the clean portion,
   wherein the portion in which the exciton is confined and localized is not in contact with a substrate, and
   wherein the portion in which the exciton is confined and localized bridges a trench or groove in the substrate.

2. The carbon nanotube single-photon source according to claim 1, wherein the exciton is confined and localized in the clean portion due to higher exciton binding energy in the clean portion than the portion that has undergone the adsorption, deposition, or encapsulation by the difference in permittivity.

3. The carbon nanotube single-photon source according to claim 1, wherein the exciton is confined and localized in the portion that has undergone the adsorption, deposition, or encapsulation due to decrease in a band gap of the portion that has undergone the adsorption, deposition, or encapsulation by the difference in permittivity.

4. The carbon nanotube single-photon source according to claim 1, wherein light emission from a thermally-excited delocalized free exciton is suppressed by a portion of the clean portion near the adsorbed, deposited, or encapsulated substance of the inorganic substance, organic substance, metal, semiconductor, or insulator, or the adsorbed, deposited, or encapsulated substance itself.

5. The carbon nanotube single-photon source according to claim 1, wherein the substance adsorbed on, deposited on, or encapsulated in the surface or inside of the suspended carbon nanotube is a conductive substance.

6. A carbon nanotube single-photon source configured to localize an exciton at high temperatures above 50 K,
   wherein the carbon nanotube single-photon source is a suspended nanotube that includes a portion that has undergone adsorption, deposition, or encapsulation and a clean portion free of the adsorption, deposition, or encapsulation,
   wherein the portion that has undergone adsorption, deposition, or encapsulation has an atom, a molecule, an inorganic or organic substance of an atomic layer or molecular layer, a metal, a semiconductor, or an insulator adsorbed on, deposited on, or encapsulated in a surface or inside of the suspended carbon nanotube,
   wherein the portion that has undergone the adsorption, deposition, or encapsulation has a permittivity higher than a permittivity of the clean portion free of the adsorption, deposition, or encapsulation, whereby an exciton is confined and localized in either the portion that has undergone adsorption, deposition, or encapsulation or the clean portion,
   wherein the portion in which the exciton is confined and localized is not in contact with a substrate, and
   wherein at least one end portion of the carbon nanotube single-photon source is in contact with a portion of the substrate.

7. The carbon nanotube single-photon source according to claim 6, wherein the at least one end portion of the carbon nanotube single-photon source is in contact with a pillar of the substrate.

8. The carbon nanotube single-photon source according to claim 6, wherein the exciton is confined and localized in the clean portion due to higher exciton binding energy in the clean portion than the portion that has undergone the adsorption, deposition, or encapsulation by the difference in permittivity.

9. The carbon nanotube single-photon source according to claim 6, wherein the exciton is confined and localized in the portion that has undergone the adsorption, deposition, or encapsulation due to decrease in a band gap of the portion that has undergone the adsorption, deposition, or encapsulation by the difference in permittivity.

10. The carbon nanotube single-photon source according to claim 6, wherein light emission from a thermally-excited delocalized free exciton is suppressed by a portion of the clean portion near the adsorbed, deposited, or encapsulated substance of the inorganic substance, organic substance, metal, semiconductor, or insulator, or the adsorbed, deposited, or encapsulated substance itself.

11. The carbon nanotube single-photon source according to claim 6, wherein the substance adsorbed on, deposited on, or encapsulated in the surface or inside of the suspended carbon nanotube is a conductive substance.

12. A carbon nanotube single-photon source configured to localize an exciton at high temperatures above 50 K,
    wherein the carbon nanotube single-photon source is a suspended nanotube that includes a portion that has undergone adsorption, deposition, or encapsulation and a clean portion free of the adsorption, deposition, or encapsulation,
    wherein the portion that has undergone adsorption, deposition, or encapsulation has an insulator deposited on a surface or inside of the suspended carbon nanotube, and
    wherein the portion that has undergone the adsorption, deposition, or encapsulation has a permittivity higher than a permittivity of the clean portion free of the adsorption, deposition, or encapsulation, whereby an exciton is confined and localized in either the portion that has undergone adsorption, deposition, or encapsulation or the clean portion.

13. A carbon nanotube single-photon source configured to localize an exciton at high temperatures above 50 K,
    wherein the carbon nanotube single-photon source is a suspended nanotube that includes a portion that has undergone adsorption, deposition, or encapsulation and a clean portion free of the adsorption, deposition, or encapsulation,
    wherein the portion that has undergone adsorption, deposition, or encapsulation has an atom, a molecule, an inorganic or organic substance of an atomic layer or molecular layer, a metal, a semiconductor, or an insulator adsorbed on, deposited on, or encapsulated in a surface or inside of the suspended carbon nanotube, wherein the portion that has undergone the adsorption, deposition, or encapsulation has a permittivity higher than a permittivity of the clean portion free of the adsorption, deposition, or encapsulation, whereby an exciton is confined and localized in either the portion that has undergone adsorption, deposition, or encapsulation or the clean portion, and wherein the carbon nanotube single-photon source is arranged on a surface of a substrate.

14. The carbon nanotube single-photon source according to claim 13, wherein the exciton is confined and localized in the clean portion due to higher exciton binding energy in the clean portion than the portion that has undergone the adsorption, deposition, or encapsulation by the difference in permittivity.

15. The carbon nanotube single-photon source according to claim 13, wherein the exciton is confined and localized in the portion that has undergone the adsorption, deposition, or encapsulation due to decrease in a band gap of the portion that has undergone the adsorption, deposition, or encapsulation by the difference in permittivity.

16. The carbon nanotube single-photon source according to claim 13, wherein light emission from a thermally-excited delocalized free exciton is suppressed by a portion of the clean portion near the adsorbed, deposited, or encapsulated substance of the inorganic substance, organic substance, metal, semiconductor, or insulator, or the adsorbed, deposited, or encapsulated substance itself.

17. The carbon nanotube single-photon source according to claim 13, wherein the substance adsorbed on, deposited on, or encapsulated in the surface or inside of the suspended carbon nanotube is a conductive substance.

* * * * *